United States Patent
Lo

(10) Patent No.: US 6,515,506 B1
(45) Date of Patent: Feb. 4, 2003

(54) CIRCUIT FOR REDUCING PIN COUNT OF A SEMICONDUCTOR CHIP AND METHOD FOR CONFIGURING THE CHIP

(75) Inventor: William Lo, Cupertino, CA (US)

(73) Assignee: Marvell International, Ltd., Hamilton (BM)

( * ) Notice: Subject to any disclaimer, the term of this patent is extended or adjusted under 35 U.S.C. 154(b) by 0 days.

(21) Appl. No.: 09/564,711

(22) Filed: May 3, 2000

(51) Int. Cl.$^7$ ............................................. H03K 19/173

(52) U.S. Cl. ........................... 326/38; 326/101; 370/258

(58) Field of Search ................................ 326/37–41, 47, 326/101; 370/258; 341/78, 79, 141

(56) References Cited

U.S. PATENT DOCUMENTS

| | | | |
|---|---|---|---|
| 5,168,573 A | * 12/1992 | Fossum et al. | 712/4 |
| 5,446,399 A | 8/1995 | Reggiardo | 326/16 |
| 5,990,577 A | * 11/1999 | Kamioka et al. | 307/26 |
| 6,020,760 A | 2/2000 | Sample et al. | 326/41 |
| 6,026,078 A | 2/2000 | Smith | 370/258 |

OTHER PUBLICATIONS

Part 3: Carrier Sense Multiple Access with Collision Detection (CSMA/CD) Access Method and Physical Layer Specifications, IEEE Std 802.3, 1998 Edition, Sections 14, 24, 25, 35, 36 and Supplement.

* cited by examiner

Primary Examiner—Michael Tokar
Assistant Examiner—James Cho
(74) Attorney, Agent, or Firm—Eric B. Janofsky; Harness Dickey & Pierce

(57) ABSTRACT

A circuit that reduces external terminal count of a semiconductor chip, such as a communications chip or other type of chip that requires the generation of configuration codes, by reducing the number of external input terminals required for generating the configuration data. The circuit includes multiplexers, each of which selects output data or configuration data, and includes an output in communication with a respective external output terminal of the chip. A selector is connectable between a selected one of the external output terminals and an external input terminal in communication with a memory to serially input configuration data on that output terminal to the memory to configure the chip. Thus, configuration codes are generated for the chip using a reduced number of external input terminals, thereby reducing the overall external terminal count of the chip. The circuit and chip may be embodied on a network or Ethernet card.

12 Claims, 5 Drawing Sheets

CIRCUIT FOR REDUCING PIN COUNT OF A SEMICONDUCTOR CHIP AND METHOD FOR CONFIGURING THE CHIP

FIELD OF THE INVENTION

The present invention relates to a circuit that reduces external terminal or pin count of a semiconductor chip, such as a communications chip or other type of chip that requires the generation of configuration data. More particularly, the invention relates to a circuit that reduces the number of external input terminals or pins required for generating the configuration data. The invention also relates to a method for generating configuration data for a semiconductor chip using a reduced number of external terminals or pins. The invention further relates to an Ethernet or network card in which the chip and circuit may be embodied and to which the configuration data generating method may be applied.

BACKGROUND OF THE INVENTION

Communications integrated circuits (ICs), such as Ethernet chips, are becoming more common in computers as connections to local area networks (LANs), wide area networks (WANs), and other Intranet networks become more important in day-to-day business activities. As such chips become more widely used, they are also becoming more highly integrated to perform an increasing number of interface functions. The problem is that an increase in functionality tends to increase chip pin count.

In IC design it is desirable to provide more functions using the same number of pins, or to provide the same functions using fewer pins. Using fewer pins has the advantage of reducing the size of the chip and the expense of packaging the chip. For example, a design that uses only six pins to perform a certain function is superior to a design that requires eight pins to perform the same function.

One problem in conventional communications chip design is that certain input pins are used only to configure the chip during initialization of the chip, such as at start up. Once the chip is configured these input pins are not used for any other purpose. Thus, they simply increase chip size without providing any additional functionality.

Therefore, it would be desirable to provide a communications chip which minimizes the number of input pins required for configuration and which therefore reduces the overall pin count and size of the chip.

OBJECTS AND SUMMARY OF THE INVENTION

It is therefore an object of this invention to provide a communications chip having a reduced external terminal or pin count and therefore a reduced size.

According to one aspect of the invention, an integrated circuit is provided. The circuit comprises a plurality of multiplexers, each of which has a first input in communication with output data and a second input in communication with configuration data; a plurality of external output terminals in communication with an output of a respective one of the plurality of multiplexers; an external input terminal; and a memory in communication with the external input terminal. In operation, the external input terminal is connectable with a selected one of the plurality of external output terminals.

Preferably, the integrated circuit further comprises a signal generator in communication with the second input of each of the plurality of multiplexers.

Preferably, the configuration data comprises an n-bit sequence, and the memory comprises an n-bit shift register.

According to another aspect of the invention, the integrated circuit further comprises a second external input terminal and a second memory in communication with the second external input terminal, wherein the second external input terminal is connectable with a selected one of the plurality of external output terminals. In this case, the configuration data may comprise an n-bit sequence and an m-bit sequence, and the first memory comprises an n-bit shift register and the second memory comprises an m-bit shift register.

According to a further aspect of the invention, the integrated circuit may be formed on a circuit board which further includes a connector in communication with the external input terminal and selected one of the plurality of external output terminals. The circuit board may further include a plurality of light emitting diodes, each in communication with a respective one of the plurality of external output terminals.

According to yet another aspect of the invention, a method for configuring an integrated circuit is provided. The method comprises (a) selecting output data or configuration data to generate a plurality of output streams; (b) outputting from the integrated circuit each of the plurality of output streams; (c) inputting to the integrated circuit one of the plurality of output streams; and (d) storing configuration data input in step (c) when configuration data is selected in step (a).

The configuration data preferably comprises an n-bit sequence, and the memory means comprises an n-bit shift register.

According to still another aspect of the invention, a network communications system is provided which includes a computer system that comprises the above-described integrated circuit and a connector in communication with the external input terminal and a selected one of the plurality of external output terminals. The system may further include a plurality of light emitting diodes, each in communication with a respective one of the plurality of external output terminals.

Other objects and attainments together with a fuller understanding of the invention will become apparent and appreciated by referring to the following description and claims taken in conjunction with the accompanying drawings.

DETAILED DESCRIPTION OF THE INVENTION

Figure 1:
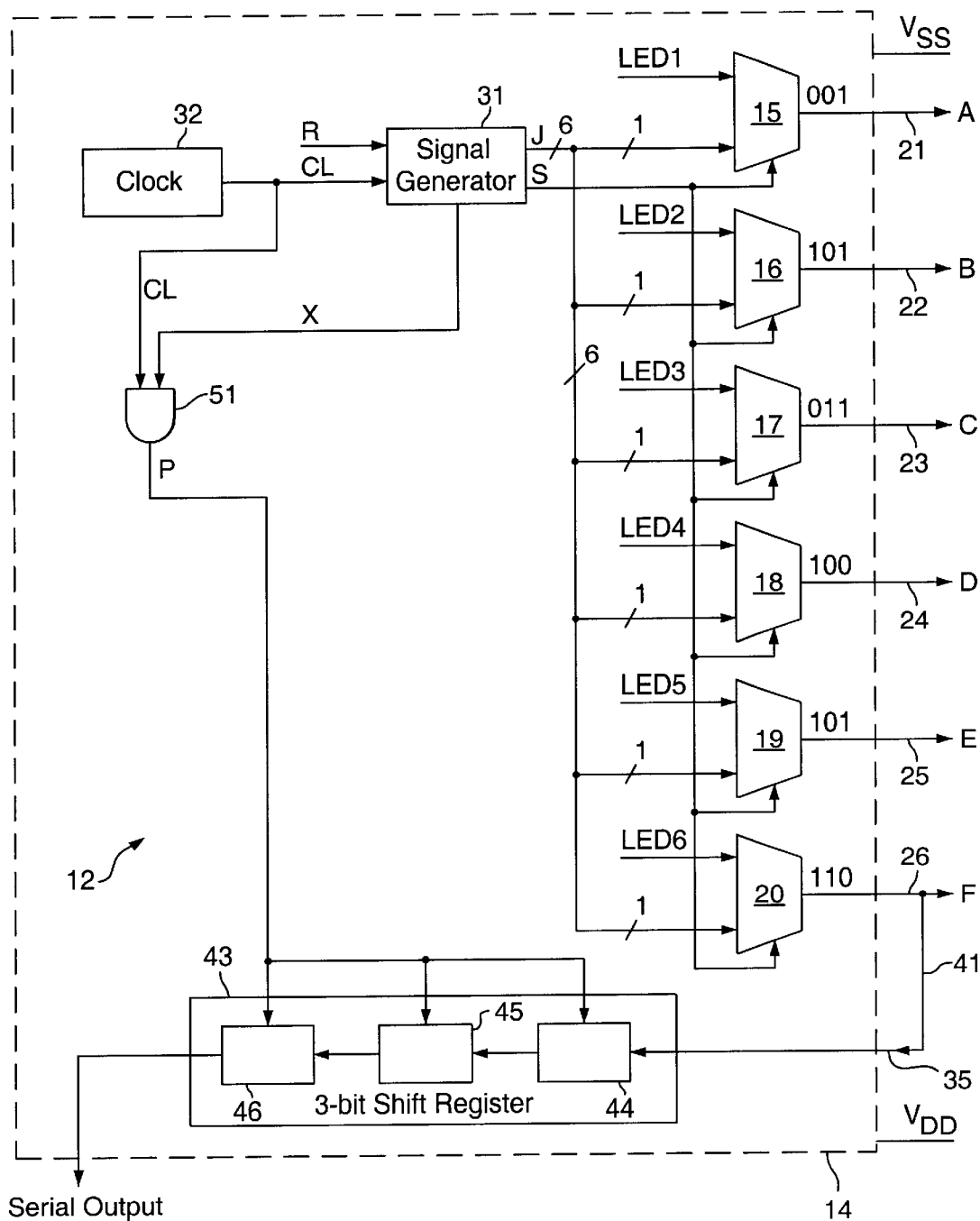
FIG. 1 and FIG. 1a are functional block diagrams of an integrated circuit, constructed in accordance with aspects of the invention.

Referring to FIG. 1, an integrated circuit 12 illustrates aspects of the invention. The circuit 12 may be embodied on a circuit board or semiconductor chip 14, such as a communications chip, which may be, for example, an Ethernet transceiver for use in 1000BASE-T, 100BASE-TX or 10BASE-T applications. While the present invention has particular utility in connection with an Ethernet communications chip operating in accordance with Ethernet standards and protocols, the invention is not so limited. The invention may also be employed with other communications chips operating according to other network standards and protocols, or with other chips that require the generation of configuration data.

In accordance with the invention, circuit 12 is designed to reduce the external terminal count of chip 14 by reducing the number of external input terminals needed for generating configuration data, e.g., during initialization of the chip. The circuit 12 includes a plurality of multiplexers 15, 16, 17, 18, 19 and 20, each having an output in communication with a respective one of a plurality of external output terminals, such as output pins 21, 22, 23, 24, 25 and 26 on which digital output signals A, B, C, D, E and F are generated. Each output signal is representative of a sequence one or more bits in length. In the illustrated embodiment, these sequences each comprise 3 bits. Thus, output signals A, B, C, D, E and F represent bit sequences 001, 010, 011, 100, 101 and 110 respectively. Bit sequences 000 and 111 are respectively generated from the $V_{SS}$ and $V_{DD}$ connections of the chip. With a 3-bit sequence generated on each output pin, six output pins plus $V_{SS}$ and $V_{DD}$ are used to generate all possible 3-bit combinations. However, different bit sequence lengths will require different numbers of output pins. In general, with $V_{SS}$ and $V_{DD}$ being used to respectively generate the all low and the all high sequences, the number of output pins needed to generate all combinations of an n-bit sequence is $2^n-2$.

Each multiplexer has a first input in communication with primary output data of the Ethernet transceiver which may be a light emitting diode (LED) signal. In the illustrated embodiment, there are six primary output data signals, designated LED1 through LED6, one for each multiplexer. LED1 through LED6 are generated by an on-chip controller (not shown). Each multiplexer also has a second input in communication with a configuration data signal J. The configuration data signal J is generated by an appropriate signal generator 31 that is controlled by a timing device such as a clock 32. Each of the multiplexers also receives a selection signal S that determines which of the two inputs is selected.

Figure 1A:
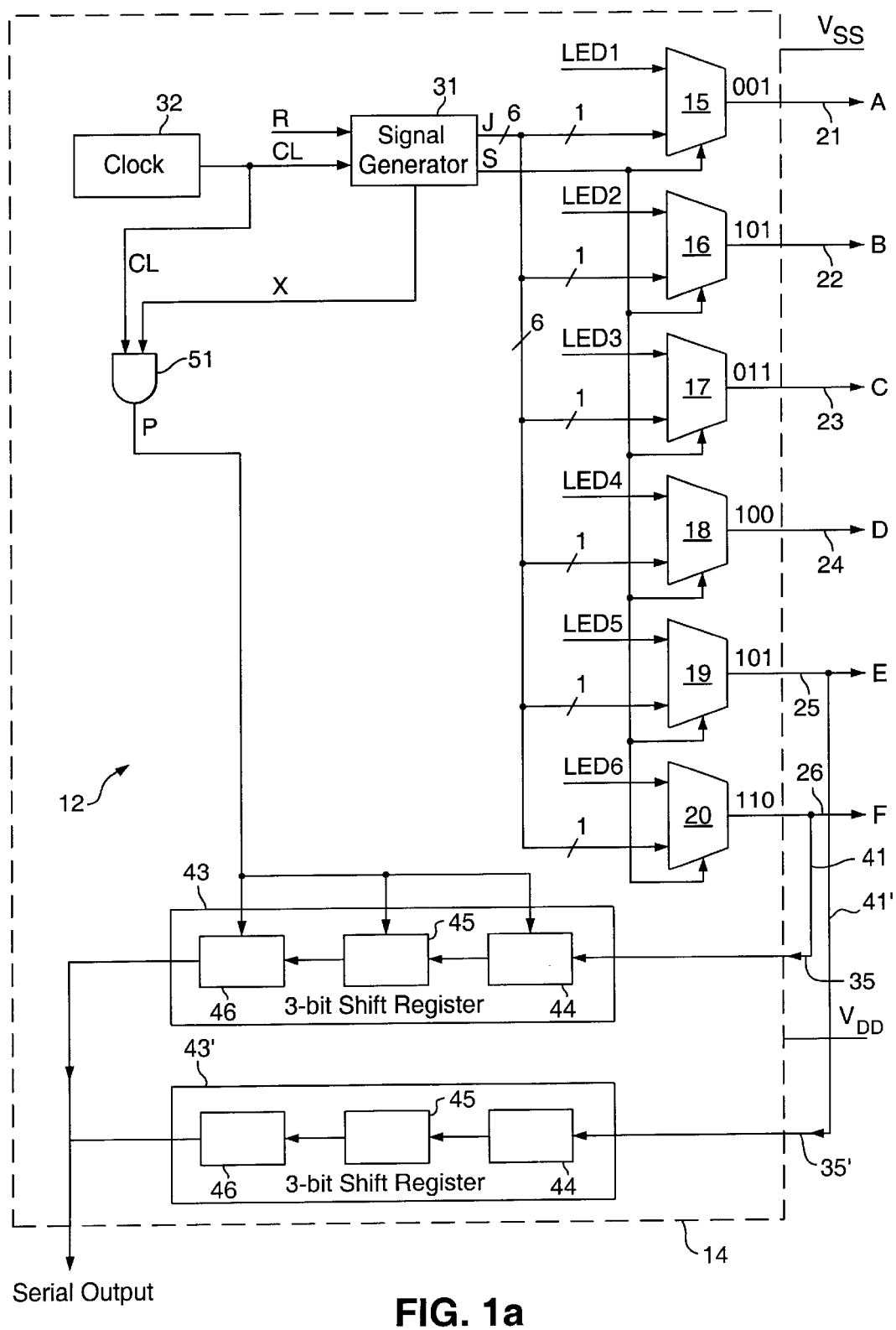

In accordance with the invention, a selected number of external output terminals or pins are used to generate configuration data through a reduced number of external input terminals or pins. In the case where each output pin generates a 3-bit sequence and a 3-bit configuration code is needed to configure the chip, an appropriate one of the output pins, $V_{SS}$ or $V_{DD}$, according to which 3-bit value is desired, is coupled, via a selector 71, to a single external input terminal, such as input pin 35, that is in communication with the serial input of a shift register 43. Selector 41 may be a jumper, DIP switch, or equivalent structure. This is merely one example of how to generate a single 3-bit configuration code, where 3-bit sequences are generated on the output pins, $V_{SS}$ or $V_{DD}$. However, the invention is not so limited. The present invention further may comprise a second memory 43' in communication with a second external input terminal 35', such that the second external input terminal 43' is connectable via selector 41' with a selected one of the plurality of external output terminals as shown in FIG. 1a.

As previously noted, n-bit sequences can be generated using $2^n-2$ output pins plus $V_{SS}$ and $V_{DD}$. Thus, in general, if q n-bit configuration codes are needed to configure the chip, then circuit 12 includes q n-bit shift registers, q input pins, each coupled to the input of a respective one of the q shift registers, and q selectors, one associated with a respective one of the q shift registers. In this general case, each of the q selectors is coupled to an output pin, $V_{SS}$ or $V_{DD}$ to input the desired n-bit configuration code into the corresponding shift register. Depending on the desired codes to be input, selectors may be coupled to the output pins, $V_{SS}$ and $V_{DD}$ in any number of different combinations, including combinations where more than one selector is coupled to the same output pin.

Also, each of the q configuration codes may be of different bit lengths, in which case the q shift registers may also be of different sizes. For example, the configuration data may comprise an n-bit sequence that is shifted into to a first n-bit shift register and an m-bit sequence that is shifted into a second m-bit shift register.

Each of the shift registers 43 may be implemented, for example, with a chain of n flip-flops connected in cascade, with the output of one flip-flop connected to the input of the next flip-flop. In the illustrated embodiment, a 3-bit shift register having 3 flip-flops, respectively identified by the reference numerals 44, 45 and 46, is shown. Each flip-flop stores one bit of information and receives a pulse P from a two-input AND gate 51 that causes that flip-flop to shift its binary information one position to the left. The serial input on input pin 35 determines what goes into the rightmost flip-flop, e.g., flip-flop 44, during the shift, and the contents of the left-most flip-flop, e.g., flip-flop 46, determines the serial output of the shift register.

The AND gate 51 controls the shift so that it occurs only with certain clock signals but not with others. Specifically, the serial shift of information occurs only when both the clock signal CL and a shift control signal X, which are inputs to the AND gate, are in the "1" or "high" state. Signal X is generated by signal generator 31 in response to an externally generated reset signal R. Signal X is synchronized with signals J and S also generated by the signal generator and changes value just after the negative edge of a clock pulse, as shown in the timing diagram of FIG. 2.

Figure 2:
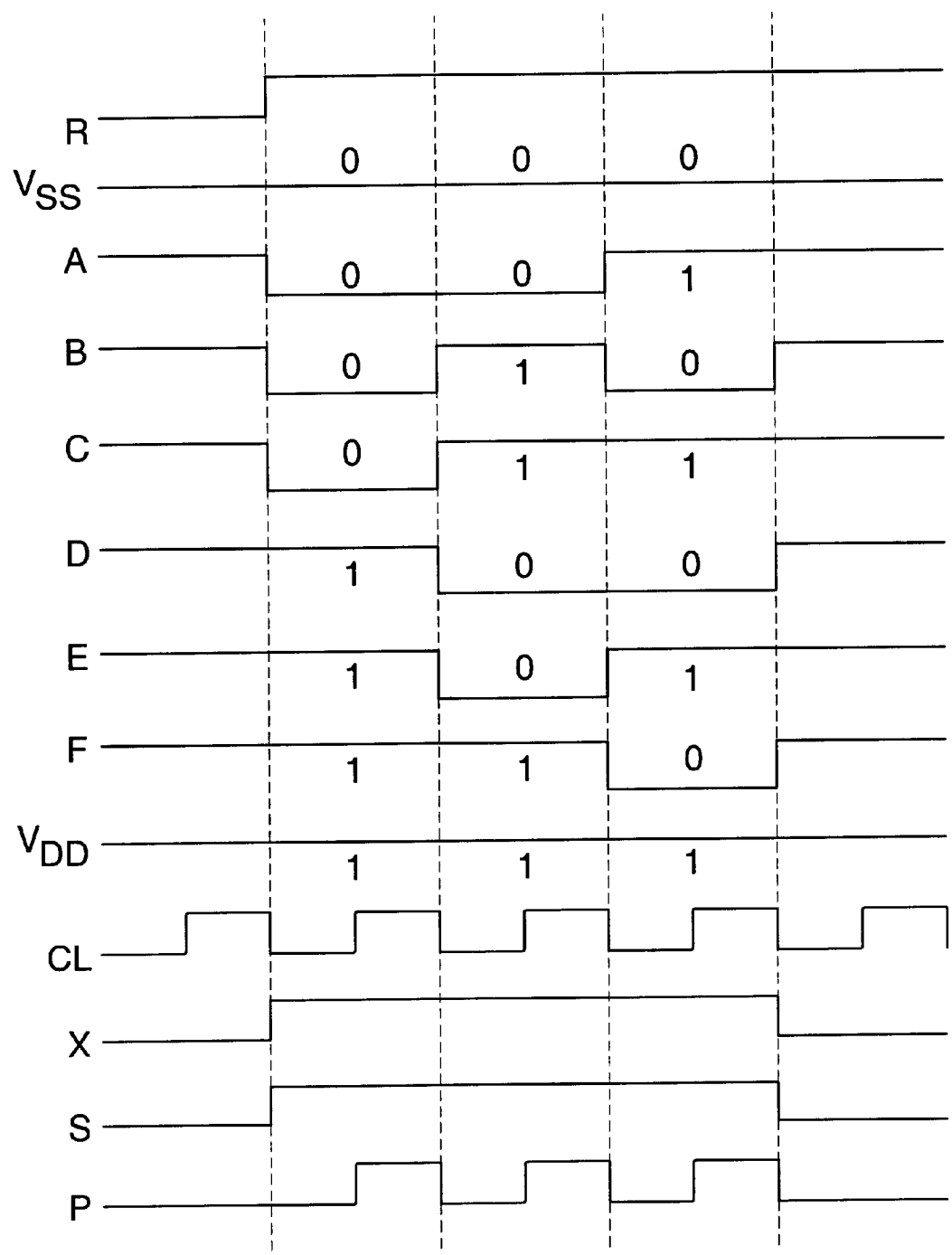
FIG. 2 is a timing diagram illustrating the timing of various signals identified in FIG. 1.

FIG. 2 also shows the timing of reset signal R, output signals A through F, $V_{SS}$, $V_{DD}$, select signal S, and the pulse signal P generated by AND gate 51.

Figure 3:
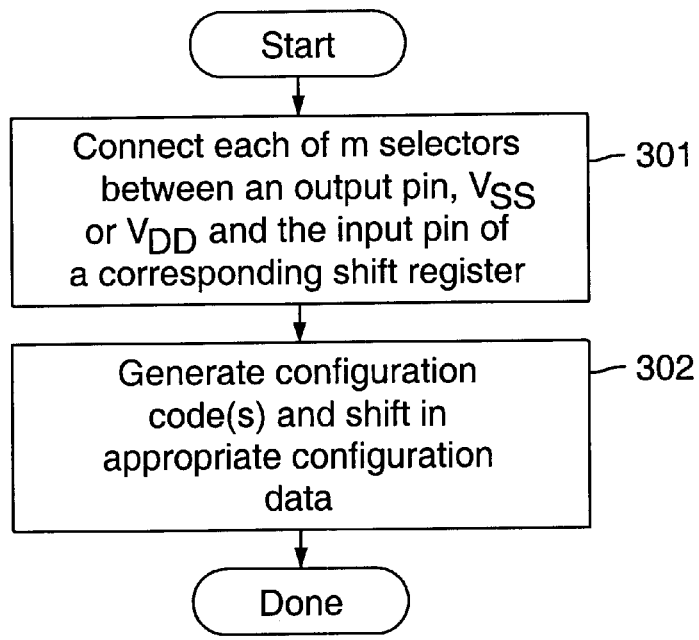
FIG. 3 is a flow chart illustrating a process by which configuration data is generated, in accordance with an aspect of the invention.

FIG. 3 is a flow chart illustrating a process by which configuration data is generated using the output pins and a reduced number of input pins, in accordance with another aspect of the invention. In step 301, each of q selectors 41 is connected between (i) an output pin, $V_{SS}$ or $V_{DD}$ and (ii) a corresponding input pin of a particular shift register. For each selector so connected, a configuration code is then generated on that output pin, $V_{SS}$ or $V_{DD}$ and shifted in to a particular shift register in step 302. This is done by serially inputting the configuration code on that output pin, $V_{SS}$ or $V_{DD}$ into the particular shift register, as described above.

By employing only one input pin for each of the q configuration codes, the number of input pins on the chip is reduced from q×n to q, in the case where all of the configuration codes are of the same length. This is a significant reduction when n is large. Such a reduction of input pins has the further advantage of reducing the size of the chip.

Figure 4:
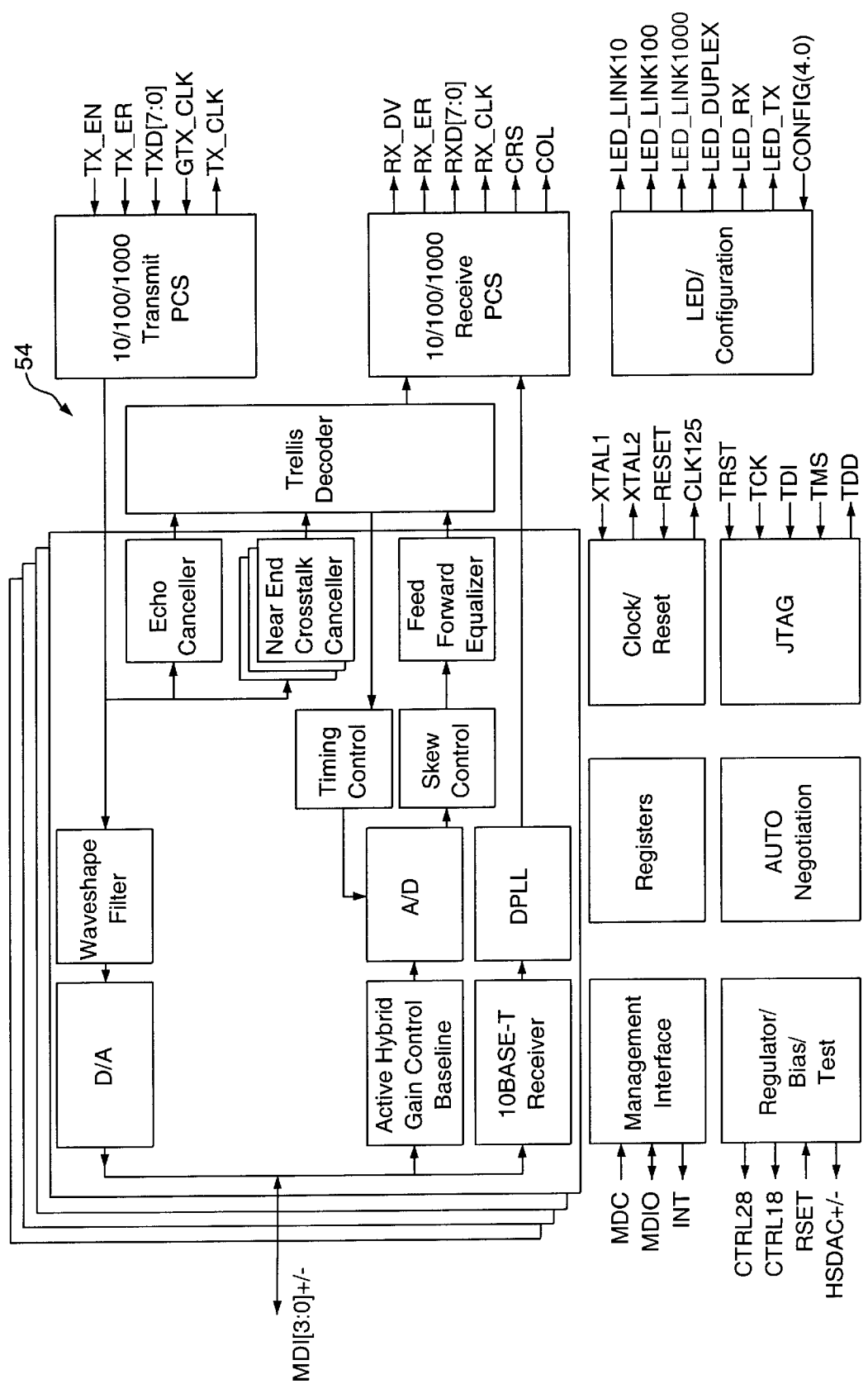
FIG. 4 is a functional block diagram of an exemplary network communications chip in which the circuit of FIG. 1 may be embodied.

As previously noted, circuit 12 may be embodied on a network communications chip, such as an Ethernet transceiver, which may be, for example, a highly integrated physical layer device for Ethernet applications. FIG. 4 is a functional block diagram of such a device 54 in which circuit 12 may be embodied. The illustrated chip is manufactured using digital CMOS process and contains all of the active circuitry required to implement the physical layer functions to transmit and receive data on standard CAT5 unshielded twisted pair cable.

The illustrated chip has an IEEE 802.3 compliant Gigabit Media Independent Interface (GMII) and a 10-bit (TBI) interface that interfaces directly onto a MAC/switch port. Speed selection is achieved through the Auto-Negotiation function. Mixed-signal processing technology is employed to perform equalization, echo and cross-talk cancellation, data recovery and error correction at a gigabit per second data rate.

Figure 5:
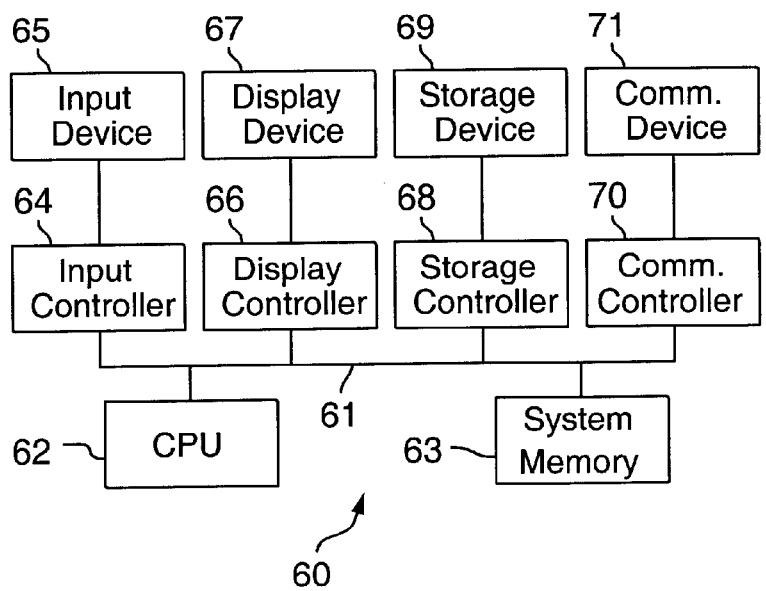
FIG. 5 is a functional block diagram illustrating the architecture of an exemplary computer system in which the network communications chip of FIG. 4 may be used.

The network communications chip illustrated in FIG. 4 is adapted to be used in connection with a computer system to enable the computer to link with other computers in a network, such as a LAN. FIG. 5 is a functional block diagram illustrating the architecture of an exemplary computer system 60 that may be employed in such a network using the network communications chip.

The computer system includes bus 61 that interconnects central processing unit (CPU) 62, system memory 63 and device interfaces. Bus 61 can be implemented by more than one physical bus such as a system bus and a processor local bus. CPU 62 represents processing circuitry such as a microprocessor, and may also include additional processors such as a floating point processor or a graphics processor. System memory 63 may include various memory components, such as random-access memory (RAM) and read-only memory (ROM).

Input controller 64 represents interface circuitry that connects to one or more input devices 65 such as a keyboard, mouse, track ball and/or stylus. Display controller 66 represents interface circuitry that connects to one or more display devices 67 such as a cathode ray tube (CRT) display, liquid crystal display (LCD), or thin film transistor (TFT) display. Storage controller 68 represents interface circuitry that connects to one or more external and/or internal storage devices 69, such as a magnetic disk or tape drive, optical disk drive or solid-state storage device, which may be used to store programs and data.

In accordance with this aspect of the invention, computer system 60 further includes a communications controller 70 that represents interface circuitry which is adapted to connect to a communications device 71, such as a network card in which network communications chip 14 and circuit 12 are embodied. When so connected, the network card enables computer system 60 to link to other computers in the network, while incorporating the features and advantages provided by the invention.

It should be readily apparent from the foregoing description that the present invention provides a circuit that reduces the external terminal count of a communications chip by reducing the number of external input terminals required for generating configuration data during initialization of the chip. In the illustrated embodiment, the external input and output terminals are pins; however, the invention is not so limited. More broadly, the external terminals may be external connections, ball gate arrays, as well as other equivalent structure. The invention is also applicable to other types of chips where generation of configuration data is necessary or desirable.

While the invention has been described in conjunction with specific embodiments, many further alternatives, modifications, variations and applications will be apparent to those skilled in the art in light of the foregoing description. Thus, the invention described herein is intended to embrace all such alternatives, modifications, variations and applications as may fall within the spirit and scope of the appended claims.

What is claimed is:

1. An integrated circuit, comprising:
   a plurality of multiplexers, each of which has a first input in communication with output data and a second input in communication with configuration data;
   a plurality of external output terminals in communication with an output of a respective one of the plurality of multiplexers;
   an external input terminal; and
   a memory in communication with the external input terminal;
   wherein the external input terminal is connectable with a selected one of the plurality of external output terminals, and
   wherein the configuration data comprises an n-bit sequence, and wherein the memory comprises an n-bit shift register.

2. An integrated circuit, comprising:
   a plurality of multiplexers, each of which has a first input in communication with output data and a second input in communication with configuration data;
   a plurality of external output terminals in communication with an output of a respective one of the plurality of multiplexers;
   an external input terminal;
   a memory in communication with the external input terminal;
   wherein the external input terminal is connectable with a selected one of the plurality of external output terminals; and
   a second external input terminal and a second memory in communication with the second external input terminal, wherein the second external input terminal is connectable with a selected one of the plurality of external output terminals,
   wherein the configuration data comprises an n-bit sequence and an m-bit sequence, and wherein the first memory comprises an n-bit shift register and the second memory comprises an m-bit shift register.

3. A circuit board, comprising:
   an integrated circuit, comprising;
      a plurality of multiplexers, each of which has a first input in communication with output data and a second input in communication with configuration data;
      a plurality of external output terminals in communication with an output of a respective one of the plurality of multiplexers;
      an external input terminal; and
      a memory in communication with the external input terminal; and
   a connector in communication with the external input terminal and a selected one of the plurality of external output terminals,
   wherein the configuration data comprises an n-bit sequence, and wherein the memory comprises an n-bit shift register.

4. A circuit board, comprising:
an integrated circuit, comprising;
  a plurality of multiplexers, each of which has a first input in communication with output data and a second input in communication with configuration data;
  a plurality of external output terminals in communication with an output of a respective one of the plurality of multiplexers;
  an external input terminal;
  a memory in communication with the external input terminal;
  a connector in communication with the external input terminal and a selected one of the plurality of external output terminals; and
a second external input terminal and a second memory in communication with the second external input terminal, wherein the second external input terminal is connectable with a selected one of external output terminals,
wherein the configuration data comprises an n-bit sequence and an m-bit sequence, and wherein the first memory comprises an n-bit shift register and the second memory comprises an m-bit shift register.

5. An integrated circuit, comprising:
a plurality of selecting means, each for selecting configuration data or output data;
a plurality of external output means for outputting data selected by a respective one of the plurality of selecting means;
external input means for inputting configuration data, wherein the external input means is connectable with a selected one of the plurality of external output means; and
memory means for storing configuration data received from the external input means,
wherein the configuration data comprises an n-bit sequence, and wherein the memory means comprises an n-bit shift register.

6. An integrated circuit, comprising:
a plurality of selecting means, each for selecting configuration data or output data;
a plurality of external output means for outputting data selected by a respective one of the plurality of selecting means;
external input means for inputting configuration data, wherein the external input means is connectable with a selected one of the plurality of external output means;
memory means for storing configuration data received from the external input means, and
a second external input means and second memory means for storing configuration data received from the second external input means, wherein the second external input means is connectable with a selected one of the plurality of external output means,
wherein the configuration data comprises an n-bit sequence and an m-bit sequence, and wherein the first memory means comprises an n-bit shift register and the second memory means comprises an m-bit shift register.

7. A circuit board, comprising:
an integrated circuit, comprising
  a plurality of selecting means, each for selecting configuration data or output data;
  a plurality of external output means for outputting data selected by a respective one of the plurality of selecting means;
  external input means for inputting configuration data; and
  memory means for storing configuration data received from the external input means; and
connector means for connecting the external input means with a selected one of the plurality of external output means,
wherein the configuration data comprises an n-bit sequence, and wherein the memory means comprises an n-bit shift register.

8. A circuit board, comprising:
an integrated circuit, comprising
  a plurality of selecting means, each for selecting configuration data or output data;
  a plurality of external output means for outputting data selected by a respective one of the plurality of selecting means;
  external input means for inputting configuration data; and
  memory means for storing configuration data received from the external input means; and
connector means for connecting the external input means with a selected one of the plurality of external output means,
a second external input means and second memory means for storing configuration data received from the second external input means, wherein the second external input means is connectable with a selected one of the plurality of external output means,
wherein the configuration data comprises an n-bit sequence and an m-bit sequence, and wherein the first memory means comprises an n-bit shift register and the second memory means comprises an m-bit shift register.

9. A network communications system, comprising:
a computer system comprising
  an integrated circuit, comprising
    a plurality of multiplexers, each of which has a first input in communication with output data and a second input in communication with configuration data;
    a plurality of external output terminals in communication with an output of a respective one of the plurality of multiplexers;
    an external input terminal; and
    a memory in communication with the external input terminal; and
  a connector in communication with the external input terminal and a selected one of the plurality of external output terminals,
wherein the configuration data comprises an n-bit sequence, and wherein the memory comprises an n-bit shift register.

10. A network communications system, comprising:
a computer system comprising
  an integrated circuit, comprising
    a plurality of multiplexers, each of which has a first input in communication with output data and a second input in communication with configuration data;
    a plurality of external output terminals in communication with an output of a respective one of the plurality of multiplexers;

an external input terminal; and
a memory in communication with the external input terminal; and
a connector in communication with the external input terminal and a selected one of the plurality of external output terminals,
a second external input terminal and a second memory in communication with the second external input terminal, wherein the second external input terminal is connectable with a selected one of the plurality of external output terminals,
wherein the configuration data comprises an n-bit sequence and an m-bit sequence, and wherein the first memory comprises an n-bit shift register and the second memory comprises an m-bit shift register.

11. A network communications system, comprising:
a computer system comprising
an integrated circuit, comprising
a plurality of selecting means, each for selecting configuration data or output data;
a plurality of external output means for outputting data selected by a respective one of the plurality of selecting means;
external input means for inputting configuration data; and
memory means for storing configuration data received from the external input means; and
connector means for connecting the external input means with a selected one of the plurality of external output means,
wherein the configuration data comprises an n-bit sequence, and wherein the memory means comprises an n-bit shift register.

12. A network communications system, comprising:
a computer system comprising
an integrated circuit, comprising
a plurality of selecting means, each for selecting configuration data or output data;
a plurality of external output means for outputting data selected by a respective one of the plurality of selecting means;
external input means for inputting configuration data; and
memory means for storing configuration data received from the external input means; and
connector means for connecting the external input means with a selected one of the plurality of external output means,
a second external input means and second memory means for storing configuration data received from the second external input means, wherein the second external input means is connectable with a selected one of the plurality of external output means,
wherein the configuration data comprises an n-bit sequence and an m-bit sequence, and wherein the first memory means comprises an n-bit shift register and the second memory means comprises an m-bit shift register.

* * * * *